(12) United States Patent
Wu (10) Patent No.: US 11,526,080 B2
(45) Date of Patent: Dec. 13, 2022

(54) DEVICE AND METHOD FOR PHOTORESIST COATING

(71) Applicant: CHANGXIN MEMORY TECHNOLOGIES, INC., Anhui (CN)

(72) Inventor: Mifong Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/444,127

(22) Filed: Jul. 30, 2021

(65) Prior Publication Data

US 2021/0356868 A1 Nov. 18, 2021

Related U.S. Application Data

(63) Continuation of application No. PCT/CN2021/082205, filed on Mar. 22, 2021.

(30) Foreign Application Priority Data

Mar. 27, 2020 (CN) .......................... 202010230828.1

(51) Int. Cl.
*H01L 21/67* (2006.01)
*G03F 7/16* (2006.01)

(52) U.S. Cl.
CPC ................ *G03F 7/162* (2013.01); *G03F 7/16* (2013.01); *H01L 21/6715* (2013.01); *H01L 21/67017* (2013.01)

(58) Field of Classification Search
CPC . G03F 7/16; G03F 7/167; G03F 7/162; H01L 21/67017; H01L 21/6715;

(Continued)

(56) References Cited

U.S. PATENT DOCUMENTS 4,582,480 A * 4/1986 Lynch ................. C23C 16/4482
  392/394
6,470,144 B1 * 10/2002 Tarutani ............. C23C 16/4486
  118/724

(Continued)

FOREIGN PATENT DOCUMENTS

CN 1501442 A 6/2004
CN 101770050 A 7/2010

(Continued)

OTHER PUBLICATIONS

International Search Report in the international application No. PCT/CN2021/082205, dated Jun. 24, 2021.

*Primary Examiner* — Rudy Zervigon
(74) *Attorney, Agent, or Firm* — Syncoda LLC; Feng Ma (57) ABSTRACT

A photoresist coating device includes a liquid vaporization module and a photoresist coating module. The liquid vaporization module is for converting a liquid photoresist into a gaseous photoresist and conveying the gaseous photoresist to a photoresist coating module. The photoresist coating module comprises a vapor coating unit, a cover plate and a carrying table, in which the vapor coating unit comprises a vapor channel and a vapor spray hole, in which the vapor spray hole is provided through the cover plate; the carrying table is for loading a substrate; and the cover plate is provided on a side of the carrying table close to the substrate. The vapor coating unit acquires the gaseous photoresist through the vapor channel and conveys the gaseous photoresist to a surface to be coated of the substrate on the carrying table through the vapor spray hole to form a photoresist coating.

15 Claims, 4 Drawing Sheets

(58) Field of Classification Search
CPC ..... C23C 14/24; C23C 14/243; C23C 14/246; C23C 16/448; C23C 16/4481; C23C 16/4482
USPC .................................................. 118/715, 726
See application file for complete search history.

(56) References Cited

U.S. PATENT DOCUMENTS

| | | | |
|---|---|---|---|
| 8,034,176 B2* | 10/2011 | Tsukamoto | H01L 21/6875 156/345.33 |
| 10,844,484 B2* | 11/2020 | Jdira | C23C 16/4481 |
| 2004/0091618 A1 | 5/2004 | Park | |
| 2004/0113289 A1* | 6/2004 | Toda | H01L 27/11507 261/78.2 |
| 2007/0054050 A1 | 3/2007 | Lee | |
| 2019/0393105 A1 | 12/2019 | Cho et al. | |

FOREIGN PATENT DOCUMENTS

| | | |
|---|---|---|
| CN | 104808445 A | 7/2015 |
| CN | 105242494 A | 1/2016 |
| CN | 209028410 U | 6/2019 |
| EP | 3299889 A1 | 3/2018 |
| JP | H05102023 A | 4/1993 |

* cited by examiner

DEVICE AND METHOD FOR PHOTORESIST COATING

CROSS-REFERENCE TO RELATED APPLICATIONS

This application is a continuation of International Application No. PCT/CN2021/082205 filed on Mar. 22, 2021, which claims priority to Chinese Patent Application No. 202010230828.1 filed on Mar. 27, 2020. The disclosures of these applications are hereby incorporated by reference in their entirety.

BACKGROUND

Photoresist (PR), also known as fotolack, is often coated on a substrate with a coating machine when manufacturing a display product.

SUMMARY

The present disclosure relates to the field of semiconductor photolithography, and particularly, to a photoresist coating device and method.

Some examples of the present disclosure provide a device and method for photoresist coating to solve the problem of non-uniform thickness of photoresist coating.

According to a first aspect, some examples of the present disclosure provide a photoresist coating device including a liquid gasification module and a photoresist coating module, in which the liquid gasification module is for converting liquid photoresist into a gaseous photoresist and conveying the gaseous photoresist to the photoresist coating module.

The photoresist coating module includes a vapor coating unit, a cover plate, and a carrying table.

The vapor coating unit includes a vapor channel and a vapor spray hole. The vapor spray hole is provided through the cover plate. The carrying table is used for loading a substrate. The cover plate is provided on a side of the bearing table close to the substrate.

The vapor coating unit acquires the gaseous photoresist through the vapor channel, conveys the gaseous photoresist to a surface to be coated of the substrate on the carrying table through the vapor spray hole to form a photoresist coating.

According to a second aspect, some examples of the present disclosure further provide a photoresist coating method suitable for the photoresist coating device provided in any examples of the present disclosure. The method includes the following steps.

A substrate is loaded on the carrying table;

The liquid gasification module is started and conveys the gaseous photoresist to the surface to be coated of the substrate through the vapor coating unit to form the photoresist coating.

DETAILED DESCRIPTION

The present disclosure is described in further detail below with reference to the accompanying drawings and examples. It is to be understood that the specific examples described herein are merely illustrative of the present disclosure and are not intended to limit the disclosure. Additionally, it should be noted that, for ease of description, only some, but not all, structures related to the present disclosure are shown in the drawings.

A photoresist coating machine can include a turntable and a nozzle, in which the turntable has a bearing surface. When coating a photoresist on a substrate, the substrate is fixedly provided on the bearing surface of the turntable, and then a certain amount of photoresist is spin-coated on the substrate by the nozzle, and finally a photoresist layer is formed on the substrate.

Figure 1:
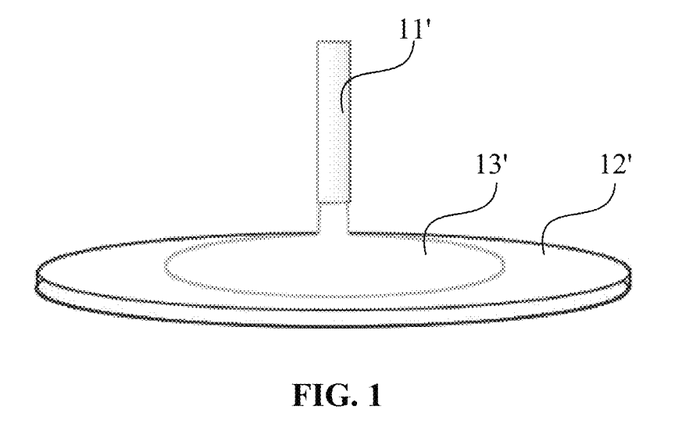
FIG. 1 is a schematic structural diagram of a photoresist coating machine.
Figure 2:
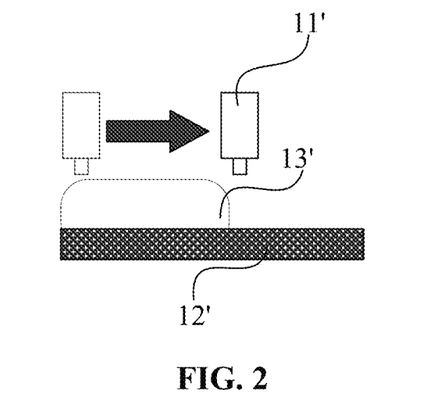
FIG. 2 is a schematic structural diagram of another photoresist coating machine.
Figure 3:
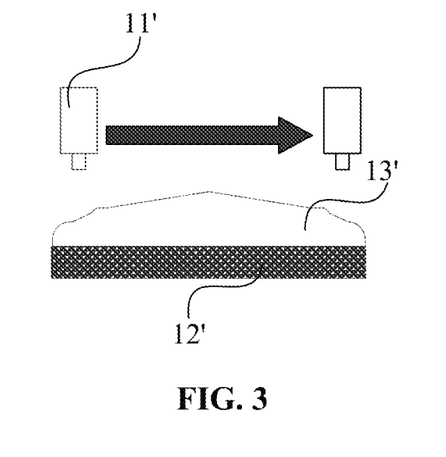
FIG. 3 is a schematic structural diagram of yet another photoresist coating machine.

Specifically, FIG. 1 is a schematic structural diagram of a photoresist coating machine. As shown in FIG. 1, the photoresist coating machine includes a turntable 12' and a nozzle 11', the turntable 12' has a bearing surface for placing a substrate to be coated with the photoresist 13'. When the photoresist 13' is coated on the substrate, the substrate is fixedly provided on the bearing surface of the turntable 12', a certain amount of the photoresist 13' is sprayed on the central region of the surface to be coated of the substrate by the nozzle 11', and then the turntable 12' is controlled to rotate to drive the substrate to rotate around the center of the substrate. During the rotation of the substrate, the photoresist 13' located in the central region of the surface to be coated diffuses to the peripheral region of the surface to be coated by a centrifugal force, and finally a photoresist layer is formed on the surface to be coated. On this basis, a movable nozzle 11' is used for coating the photoresist 13' to accelerate the coating speed of the photoresist 13', as shown in FIGS. 2 and 3. FIG. 2 is a schematic structural diagram of another photoresist coating machine. FIG. 3 is a schematic structural diagram of another photoresist coating machine. In the radial direction of the turntable 12', the movable nozzle 11' accelerates the coating progress of the photoresist 13'.

However, because of the large viscosity of the photoresist, the diffusion resistance of the photoresist on the substrate is large. Therefore, the thickness of the photoresist at the center of the substrate is different from that at the edge of the substrate, and some positions are prone to have problems such as stacking of the photoresist or difficulty in covering the photoresist. Therefore, it is difficult to coat the photoresist.

An example of the present disclosure provides a photoresist coating device, including a liquid gasification module and a photoresist coating module.

The liquid gasification module is for converting the liquid photoresist into a gaseous photoresist and conveying the gaseous photoresist to the photoresist coating module;

The photoresist coating module includes a vapor coating unit, a cover plate and a carrying table.

The vapor coating unit includes a vapor channel and a vapor spray hole, in which the vapor hole is provided through the cover plate. The carrying table is for loading a substrate. The cover plate is provided on the side of the carrying table close to the substrate.

The vapor coating unit acquires the gaseous photoresist through the vapor channel, and conveys the gaseous photoresist to the surface to be coated of the substrate on the carrying table through the vapor spray hole to form a photoresist coating.

In an example of the present disclosure, the photoresist coating device includes the liquid gasification module and the photoresist coating module, in which the liquid gasification module is capable of gasifying a liquid photoresist to a gaseous photoresist and providing the gaseous photoresist to the photoresist coating module for coating the photoresist. Specifically, the photoresist coating module includes the vapor coating unit, the cover plate and the carrying table. The vapor coating unit acquires the gaseous photoresist outputting from the liquid gasification module through the vapor channel and coats the gaseous photoresist through the vapor spray hole. The carrying table is for placing the substrate. The cover plate is provided on the side of the carrying table close to the substrate for preventing the gaseous photoresist from overflowing. In addition, the vapor spray hole is provided on the cover plate and through the cover plate, so that the gaseous photoresist can reach the surface to be coated of the substrate and is deposited on the surface to be coated to form the photoresist coating. The example of the present disclosure, the photoresist coating is formed by the gaseous photoresist though the vapor coating method, so that the thickness of the finally formed photoresist coating is the same at every position, thus the coating uniformity of the photoresist is improved. The photoresist coating device of some examples of the present disclosure is simple in structure, easy to operate, and has a high photo etching efficiency.

The above is the core idea of the present disclosure, and the technical solution in the examples of the present disclosure will be clearly and completely described below with reference to the accompanying drawings in the examples of the present disclosure. Based on the examples in the present disclosure, all other examples obtained by a person of ordinary skill in the art without involving any inventive effort fall within the scope of the present disclosure.

Figure 4:
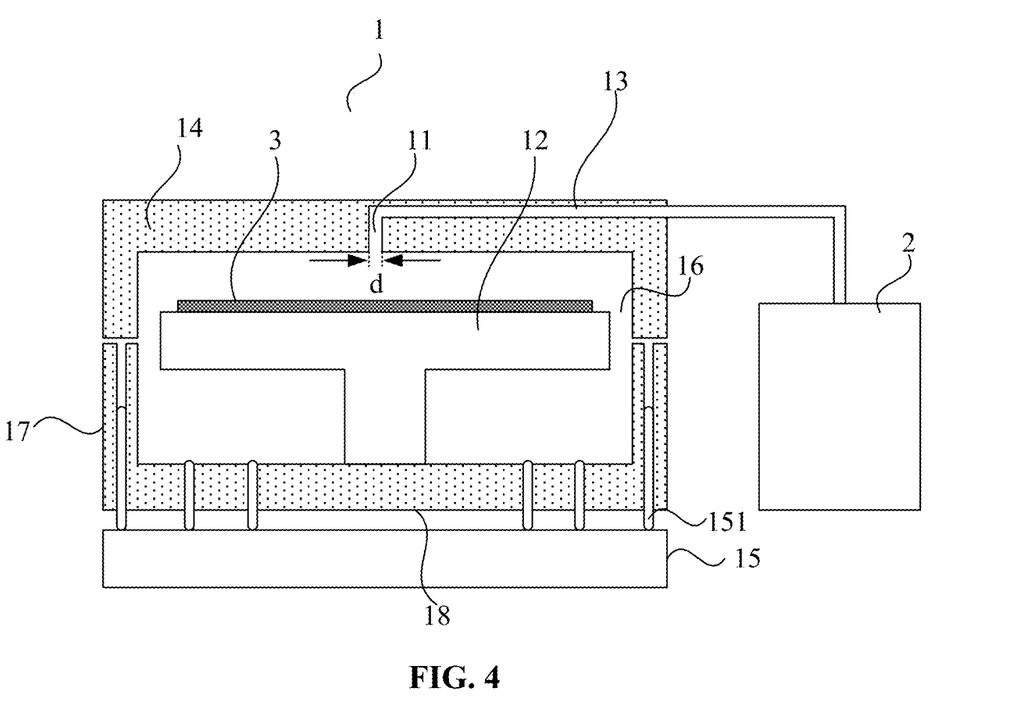
FIG. 4 is a schematic structural diagram of a photoresist coating device according to an example of the present disclosure.

In the panel manufacturing process, it is necessary to form each film structure on a substrate by multiple photolithography processes. The substrate mentioned in this example may be an underlayer substrate or an underlayer substrate having a film layer with a certain pattern formed thereon. FIG. 4 is a schematic diagram of a structure of a photoresist coating device according to an example of the present disclosure. As shown in FIG. 4, the photoresist coating device includes a photoresist coating module 1 and a liquid gasification module 2. The present example gives up the conventional process of dropping droplets of a photoresist onto a substrate through a nozzle, and instead, vaporizes a liquid photoresist to form a gaseous photoresist, and forms a photoresist coating on the substrate 3 with the gaseous photoresist. That is, a photoresist coating is formed by a vapor photoresist coating method. Therefore, the thickness of the photoresist is uniform and the accuracy of the photoresist coating process is enhanced. In this example, the liquid gasification module 2 is provided to convert the liquid photoresist into the gaseous photoresist, and then the gaseous photoresist is input to the photoresist coating module 1 for coating the gaseous photoresist on the substrate 3 layer by layer. The gaseous photoresist diffuses rapidly and uniformly, thereby forming a dense and uniform photoresist coating layer. The photoresist coating module 1 includes a vapor coating unit (including a vapor channel 13 and a vapor spray hole 11), a cover plate 14 and a carrying table 12. The carrying table 12 is used for placing or loading the substrate 3. The vapor coating unit is provided on the side of the carrying table 12 close to the substrate 3 so that the surface to be coated of the substrate 3 can contact with the gaseous photoresist. The cover plate 14 is also provided on the side of the carrying table 12 close to the substrate 3, thereby avoiding the gaseous photoresist as harmful gases entering the external environment from the photoresist coating device.

As shown in FIG. 4, the substrate 3 is loaded on the carrying table 12, and the cover plate 14 and the vapor coating unit are above the substrate 3. The vapor coating unit acquires the gaseous photoresist from the liquid gasification module 2 through the vapor channel 13, and sprays the gaseous photoresist onto the surface to be coated of the substrate 3 through the vapor spray hole 11, so that the gaseous photoresist is deposited on the surface to be coated layer by layer, thereby forming a uniform photoresist coating. The vapor spray hole 11 is arranged penetrating the cover plate 14 so that the vapor spray hole 11 can spray the gaseous photoresist onto the substrate 3. In order to save the cost of the photoresist coating device, the vapor spray hole 11 can be directly formed in the cover plate 14, that is, a through-hole is dug in the cover plate 14 to form the vapor spray hole 11. Similarly, the vapor channel 13 may be formed in the cover plate 14 to further save the manufacturing cost of the photoresist coating device.

Further referring to FIG. 4, the photoresist coating device may further include a device cavity 16 and a gas extraction unit 15. The device cavity 16 is enclosed by a side wall 17, a bottom plate 18 and the cover plate 14. The carrying table 12 is located within the device cavity 16. The gas extraction unit 15 is for extracting gases from the device cavity 16. In the present example, the vapor photoresist coating method is used to coat the photoresist, thus it is necessary to provide a relatively sealed process environment. Therefore, the device cavity 16 is enclosed by the side wall 17, the bottom plate 18 and the cover plate 14 so as to prevent the gaseous photoresist from overflowing and causing pollution of ambient air. The carrying table 12 and the substrate 3 are located within the device cavity 16. In addition, in order to prevent the problem of excessive pressure due to the continuous input of the gaseous photoresist into the device cavity 16, the gases in the device cavity 16 is extracted by the gas extraction unit 15 at an appropriate pressure to maintain the dynamic balance of the pressure in the device cavity 16.

The gas extraction unit 15 extracts the gases through a plurality of gas extraction channels 151 extending into the device cavity 16. The gas extraction channels 151 are arranged centrally symmetrically with respect to the center of the carrying table 12, so that the pressure at every position in the device cavity 16 can be balanced in the gas extraction process, thereby providing a stable process environment for the vapor photoresist coating method, and improving the uniformity of the photoresist coating thickness.

Figure 5:
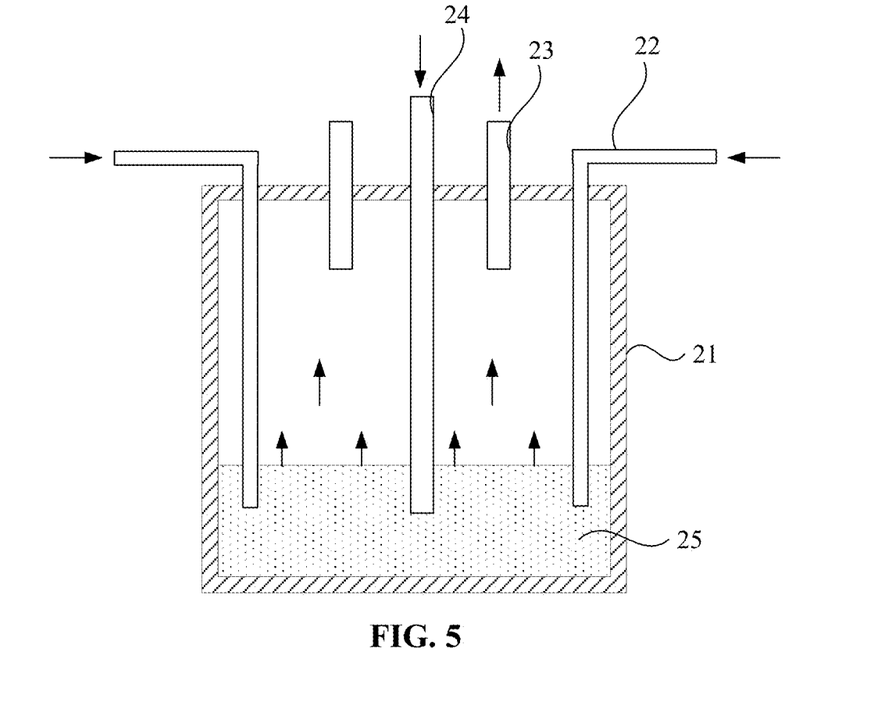
FIG. 5 is a schematic structural diagram of a liquid gasification module according to an example of the present disclosure.

Referring to FIG. 5, FIG. 5 is a schematic structural diagram of a liquid gasification module according to an example of the present disclosure. The liquid gasification module may include a liquid gasification chamber 21, a liquid channel 24, a pressurizing pipeline 22 and a vapor output end 23. The liquid channel 24 is for charging the liquid gasification chamber 21 with the liquid photoresist 25. The pressurizing pipeline 22 is for injecting a pressurized gas into the liquid gasification chamber 21 to increase the pressure in the liquid gasification chamber 21 so that the liquid photoresist 25 is gasified. The vapor output end 23 is used to output the gaseous photoresist to the vapor coating unit. In the present example, the liquid gasification module may be a liquid gasification furnace capable of changing the liquid photoresist 25 to the gaseous photoresist by pressurization. In this example, the gasification process is carried out in the liquid gasification chamber 21. The gasification process of the liquid photoresist 25 includes injecting the liquid photoresist 25 into the liquid gasification chamber 21 through the liquid channel 24; injecting the pressurized gas into the liquid gasification chamber 21 through the pressurizing pipeline 22 so as to increase the pressure in the liquid gasification chamber 21, thereby generating the gaseous photoresist. The gaseous photoresist may then be output through the vapor output end 23.

Referring to FIG. 4 and FIG. 5, the gaseous photoresist is output from the vapor output end 23 and then enters the vapor channel 13 of the photoresist coating module 1 to provide the gaseous photoresist to the photoresist coating module 1. As shown in FIG. 5, the pressurizing pipeline 22 is immersed in the liquid photoresist 25 in the liquid gasification chamber 21, and the vapor output end 23 is at a position higher than the liquid level of the liquid photoresist 25, which has advantages that the pressurized gas is brought into sufficient contact with the liquid photoresist 25 and the generated gaseous photoresist diffuses toward the top of the liquid gasification chamber 21. Therefore, the vapor output end 23 is above the liquid level of the liquid photoresist 25, and the vapor output end 23 may be provided at the top of the liquid gasification chamber 21.

The pressurized gas may be an inert gas or clean compressed air. The clean compressed air or the inert gas can avoid reaction with the photoresist and maintain the gasification environment clean, so that the pressurized gas only functions as a pressurized gas. The inert gas may be nitrogen, which is stable and does not destroy the chemical properties of the photoresist.

Figure 6:
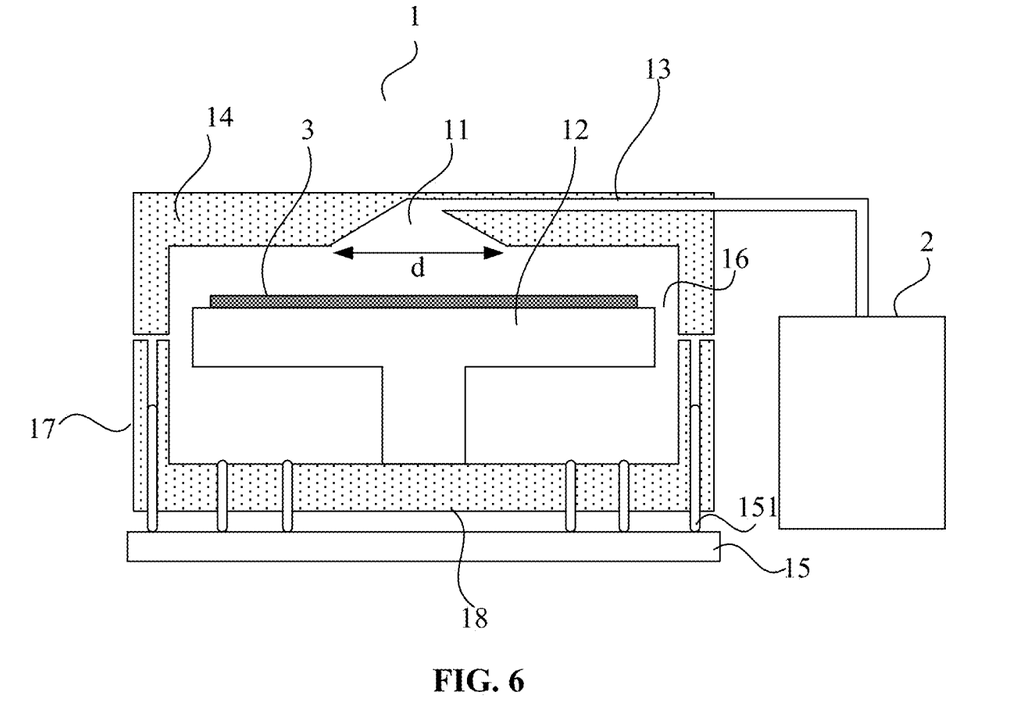
FIG. 6 is a schematic structural diagram of another photoresist coating device according to an example of the present disclosure.

FIG. 6 is a schematic diagram showing a structure of another photoresist coating device according to an example of the present disclosure. Alternatively, as shown in FIGS. 4 and 6, the vapor spray hole 11 may be conical or cylindrical in shape. FIG. 4 shows a case where the vapor spray hole 11 is cylindrical, and FIG. 6 shows a case where the vapor spray hole 11 is conical. In the present example, the vapor spray hole 11 may also have a prismatic shape, a frustum shape, or other regular or irregular shape, which is not limited in the present embodiment.

Further referring to FIG. 6, the radial dimension of the vapor spray hole 11 may be gradually increased in the direction from the cover plate 14 to the substrate 3. In order to further increase the coating speed of the vapor to the substrate 3, the radial dimension of the vapor spray hole 11 can be enlarged, and in particular, the radial dimension of the end of vapor spray hole 11 close to the substrate 3 can be enlarged. In this example, the radial dimension of the vapor spray hole 11 increases gradually in the direction close to the substrate 3, thereby effectively increasing the direct contact area between the gas photoresist and the substrate 3, thereby generating a more uniform photoresist coating with a better effect.

As shown in FIGS. 4 and 6, the radial dimension d of the end of the vapor spray hole 11 near the substrate 3 may be in a range of 1 mm~5 mm. The radial dimension d is larger than 1 mm, so that the contact area between the gaseous photoresist and the substrate 3 maintains in a large range, and the formation of the photoresist coating is accelerated. The radial dimension d is smaller than 5 mm, thereby facilitating the control of the speed and thickness of the photoresist coating formation.

Further referring to FIGS. 4 and 6, the orthographic projection of the vapor spray hole 11 on the carrying table 12 may be at the center of the carrying table 12. In the direction perpendicular to the carrying table 12, the projection of the vapor spray hole 11 on the carrying table 12 is at the center of the carrying table 12, so that the photoresist coating can be finally formed symmetrically and uniformly.

Figure 7:
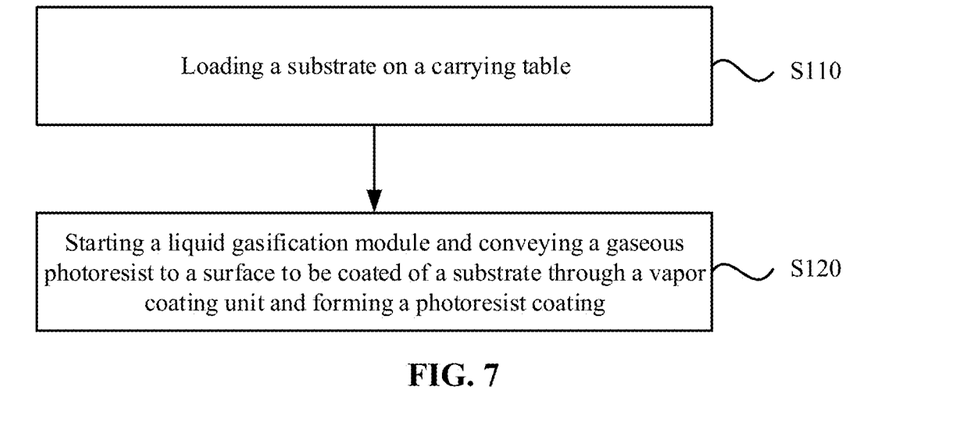
FIG. 7 is a schematic flow diagram of a photoresist coating method according to an example of the present disclosure.

Based on the same concept, an example of the present disclosure further provides a photoresist coating method by using the photoresist coating method provided in any example of the present disclosure. FIG. 7 is a schematic flow diagram of a photoresist coating method according to an example of the present disclosure. As shown in FIG. 7, the method of the present example includes the following steps.

At S110, the substrate is loaded on the carrying table.

At S120, the liquid gasification module is started, thereby conveying the gaseous photoresist to the surface to be coated of the substrate through the vapor coating unit to form the photoresist coating.

In an example of the present disclosure, the photoresist coating device includes the liquid gasification module and the photoresist coating module, in which the liquid gasification module is capable of gasifying the liquid photoresist to the gaseous photoresist and providing the gaseous photoresist to the photoresist coating module for coating the photoresist. Specifically, the photoresist coating module includes the vapor coating unit, the cover plate and the carrying table. The vapor coating unit acquires the gaseous photoresist outputting from the liquid gasification module through the vapor channel and performs the coating of the gaseous photoresist through the vapor spray hole. The carrying table is for placing the substrate. The cover plate is arranged on the side of the carrying table close to the substrate for preventing the gaseous photoresist from overflowing. The vapor spray hole is arranged on the cover plate and through the cover plate, so that the gaseous photoresist can reach the surface to be coated of the substrate and is deposited on the surface to be coated to form a photoresist coating. In the examples of the present disclosure, the photoresist coating is formed by the gaseous photoresist with the vapor coating method, so that the thickness of the finally formed photoresist coating is the same everywhere, thus the coating uniformity of the photoresist is improved. The photoresist coating device of some examples of the present disclosure is simple in structure, easy to operate, and has a high photo etching efficiency.

Figure 8:
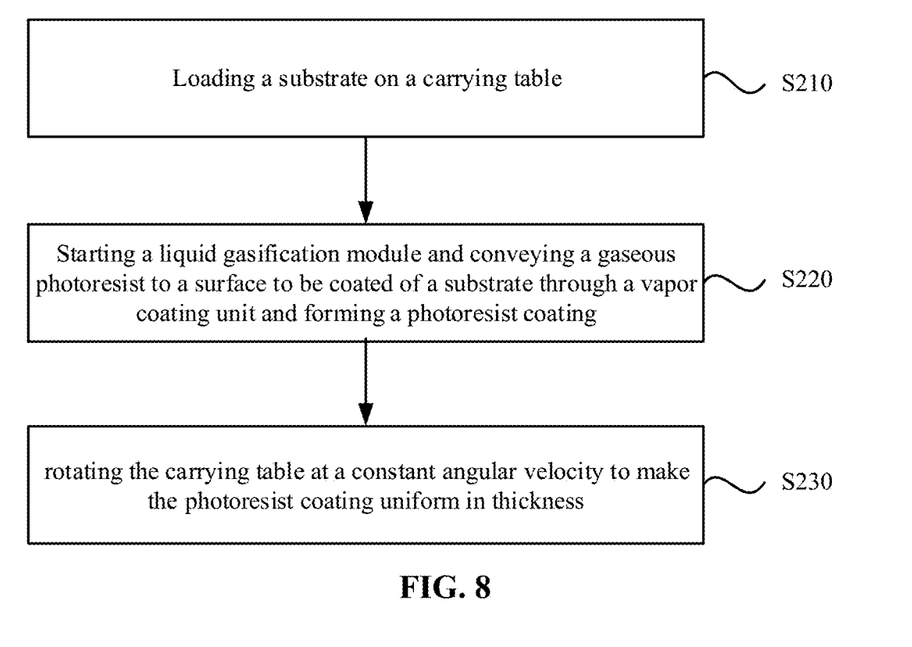
FIG. 8 is a schematic flow diagram of another photoresist coating method according to an example of the present disclosure.

On the basis of the above example, an example of the present disclosure further provides a photoresist coating method. As shown in FIG. 8, which is a schematic flow diagram of another photoresist coating method according to an example of the present disclosure, the method of the present example includes the following steps.

At S210, the substrate is loaded on the carrying table.

At S220, the liquid gasification module is started, thereby conveying the gaseous photoresist to the surface to be coated of the substrate through the vapor coating unit to form a photoresist coating.

At S230, the carrying table is rotated at a constant angular velocity so that the photoresist coating is uniform in thickness.

In the present example, when the gaseous photoresist generated by the vapor coating unit is being applied on the surface to be coated of the substrate and the photoresist coating is being formed, it is possible to control the carrying table to rotate at a constant angular velocity, so that the thickness of the photoresist coating is more uniform. In this example, S220 and S230 are performed simultaneously to facilitate the formation of a uniform and dense photoresist coating.

Referring to FIG. 4 and FIG. 6, when the gaseous photoresist generated on by a vapor coating unit is being applied to the surface to be coated of the substrate and the photoresist coating is being formed, the cavity of the device in which the carrying table is located may be extracted by a gas extraction unit, so that the pressure of the cavity of the device is prevented from being excessively high, which otherwise will affect the vapor coating effect of the gaseous photoresist, meanwhile the safety of the photoresist coating device can be effectively ensured, thereby ensuring a stable process environment.

Note that the foregoing is merely a preferred example of the present disclosure and the principles of the techniques employed. It will be understood by those skilled in the art that the present disclosure is not limited to the specific examples described herein, and that various obvious changes, modifications and substitutions can be made by those skilled in the art without departing from the scope of the present disclosure. Thus, though the present disclosure has been described in more detail by the above examples, the present disclosure is not limited only to the above examples, and many other equivalent examples may be included without departing from the spirit of the present disclosure, the scope of which is determined by the scope of the appended claims.

What is claimed is:

1. A photoresist coating device comprising:
a liquid gasification module and a photoresist coating module, wherein,
the liquid gasification module is for converting a liquid photoresist into a gaseous photoresist and conveying the gaseous photoresist to the photoresist coating module,
the photoresist coating module comprises a vapor coating unit, a cover plate, a carrying table, a device cavity, and a gas extraction unit,
the vapor coating unit comprises a vapor channel and a vapor spray hole, in which the vapor spray hole is provided through the cover plate; the carrying table is for loading a substrate; and the cover plate is provided on a side of the carrying table close to the substrate,
the vapor coating unit is configured to acquire the gaseous photoresist through the vapor channel, and convey the gaseous photoresist to a surface to be coated of the substrate on the carrying table through the vapor spray hole to form a photoresist coating,
the device cavity is enclosed by a side wall, a bottom plate, and the cover plate, and the carrying table is located within the device cavity, and
the gas extraction unit is connected with a plurality of gas extraction channels arranged centrally symmetrically with respect to a center of the carrying table and extending into the device cavity and configured to extract gases from the device cavity, wherein some of the plurality of gas extraction channels are disposed in the bottom plate with openings on a surface of the bottom plate, and others of the plurality of gas extraction channels are disposed inside the side wall with openings on an inner surface of the side wall around the carrying table.

2. The device according to claim 1, wherein the pressurized gas is an inert gas or clean compressed air.

3. The device according to claim 1, wherein
a radial dimension of an end of the vapor spray hole near the substrate is in a range of 1 mm~5 mm.

4. The device according to claim 1, wherein a radial dimension of the vapor spray hole is gradually increased in a direction from the cover plate to the substrate.

5. The device according to claim 1, wherein a shape of the vapor spray hole is conical or cylindrical.

6. The device according to claim 1, wherein an orthographic projection of the vapor spray hole on the carrying table is at a center of the carrying table.

7. A photoresist coating method performed with the photoresist coating device of claim 1,
the method comprising:
loading a substrate on the carrying table; and
starting the liquid gasification module and conveying the gaseous photoresist to the surface to be coated of the substrate through the vapor coating unit and forming the photoresist coating.

8. The method according to claim 7, wherein during the gaseous photoresist is conveyed to the surface to be coated of the substrate by the vapor coating unit and the photoresist coating is formed, the method further comprises:
rotating the carrying table at a constant angular velocity to make the photoresist coating uniform in thickness.

9. The method according to claim 7, wherein
the liquid gasification module comprises a liquid gasification chamber, a liquid channel, a pressurizing pipeline, and a vapor output end;
the liquid channel is configured to charge the liquid photoresist into the liquid gasification chamber;
the pressurizing pipeline is configured to inject pressurized gas into the liquid gasification chamber to increase a pressure in the liquid gasification chamber such that the liquid photoresist is gasified; and
the vapor output end is configured to output the gaseous photoresist to the vapor coating unit.

10. The method according to claim 9, wherein the pressurized gas is an inert gas or clean compressed air.

11. The method according to claim 7, wherein
a radial dimension of an end of the vapor spray hole near the substrate is in a range of 1 mm~5 mm.

12. The method according to claim 7, wherein a radial dimension of the vapor spray hole is gradually increased in a direction from the cover plate to the substrate.

13. The method according to claim 7, wherein a shape of the vapor spray hole is conical or cylindrical.

14. The method according to claim 7, wherein an orthographic projection of the vapor spray hole on the carrying table is at a center of the carrying table.

15. The device according to claim 1, wherein
the liquid gasification module comprises a liquid gasification chamber, a liquid channel, a pressurizing pipeline, and a vapor output end;
the liquid channel is configured to charge the liquid photoresist into the liquid gasification chamber;

the pressurizing pipeline is configured to inject pressurized gas into the liquid gasification chamber to increase a pressure in the liquid gasification chamber such that the liquid photoresist is gasified; and the vapor output end is configured to output the gaseous photoresist to the vapor coating unit.

* * * * *